(12) United States Patent
Iwagami et al.

(10) Patent No.: US 10,615,707 B2
(45) Date of Patent: Apr. 7, 2020

(54) INVERTER CONTROL DEVICE

(71) Applicant: Nidec Elesys Corporation, Kawasaki-shi, Kanagawa (JP)

(72) Inventors: Naoki Iwagami, Kawasaki (JP); Hitoshi Kuroyanagi, Kawasaki (JP)

(73) Assignee: NIDEC ELESYS CORPORATION, Kanagawa (JP)

( * ) Notice: Subject to any disclaimer, the term of this patent is extended or adjusted under 35 U.S.C. 154(b) by 0 days.

(21) Appl. No.: 16/394,419

(22) Filed: Apr. 25, 2019

(65) Prior Publication Data
US 2019/0334447 A1   Oct. 31, 2019

(30) Foreign Application Priority Data
Apr. 25, 2018 (JP) ................. 2018-084581

(51) Int. Cl.
| | |
|---|---|
| *H05K 5/00* | (2006.01) |
| *H05K 7/00* | (2006.01) |
| *H02M 7/00* | (2006.01) |
| *H02K 11/33* | (2016.01) |
| *H02M 7/5387* | (2007.01) |
| *H05K 5/04* | (2006.01) |
| *H05K 5/02* | (2006.01) |
| *H02K 7/116* | (2006.01) |
| *B60L 15/00* | (2006.01) |
| *B60K 6/22* | (2007.10) |
| *H02P 27/08* | (2006.01) |

(52) U.S. Cl.
CPC ............ *H02M 7/003* (2013.01); *H02K 11/33* (2016.01); *H02M 7/53871* (2013.01); *H05K 5/0017* (2013.01); *H05K 5/0247* (2013.01); *H05K 5/04* (2013.01); *B60K 6/22* (2013.01); *B60L 15/007* (2013.01); *B60Y 2200/91* (2013.01); *B60Y 2200/92* (2013.01); *B60Y 2400/61* (2013.01); *H02K 7/116* (2013.01); *H02P 27/08* (2013.01)

(58) Field of Classification Search
CPC ........................................................ H05K 5/00
See application file for complete search history.

(56) References Cited

U.S. PATENT DOCUMENTS

| | | | |
|---|---|---|---|
| 2003/0133259 A1* | 7/2003 | Meyer ................... | B60L 15/007 361/677 |
| 2012/0306213 A1* | 12/2012 | Hubbers .............. | H05K 7/1432 290/55 |

FOREIGN PATENT DOCUMENTS

| | | |
|---|---|---|
| JP | 2014-068428 A | 4/2014 |
| JP | 6104347 B1 | 3/2017 |

* cited by examiner

*Primary Examiner* — Jerry Wu
(74) *Attorney, Agent, or Firm* — Keating & Bennett

(57) ABSTRACT

An inverter control device to drive a motor includes a power module that supplies a driving current to the motor. The inverter control device further includes a power module board that outputs a driving signal to the power module, a control board that outputs a control signal to the power module board, and a smoothing capacitor. The power module, the power module board, the capacitor, and the control board are sequentially stacked and accommodated in a single casing made of a metal material, the power module being a bottommost layer. An input terminal of a power supply current is located on one side surface of the casing and an output terminal of a driving current of the motor is located on another side surface of the casing orthogonal to the one side surface, and the output terminal and a bus bar connected to the power module are directly connected to each other in a same plane.

16 Claims, 6 Drawing Sheets

INVERTER CONTROL DEVICE

CROSS REFERENCE TO RELATED APPLICATION

The present invention claims priority under 35 U.S.C. § 119 to Japanese Application No. 2018-084581 filed on Apr. 25, 2018 the entire contents of which is incorporated herein by reference.

1. FIELD OF THE INVENTION

The present disclosure relates to a structure of an inverter control device that is an in-vehicle power conversion device.

2. BACKGROUND

Electric cars, hybrid cars, and the like in which an electric motor is a driving source have been becoming popular as environmentally friendly vehicles in recent years. In those electric cars and the like, an inverter device (power conversion device) that accelerates and decelerates a vehicle by converting DC power from a battery to AC power to be supplied to a driving motor and controlling a motor rotation speed, a driving torque, and the like is installed.

For the inverter device as above, downsizing focusing on the vehicle installation facility is required in addition to high performance and high reliability. In particular, there has hitherto been a strong demand for downsizing of an in-vehicle inverter device due to restrictions of the space in the vehicle in which the in-vehicle inverter device is installed, for example.

For example, as a power conversion device of the related art, there is a power conversion device including a power system main circuit unit that performs power conversion, a control circuit unit that controls the operation of the power system main circuit unit, an input/output filter circuit unit that suppresses the outflow of a noise to the outside, a control circuit unit, and the like.

In addition, the power conversion device (inverter device) of the related art may be downsized by placing an inverter, a capacitor, a reactor, and the like on a base to form the power conversion device as one structure.

In the power conversion device of the related art, the power system main circuit unit, the control circuit unit, and the like are planarly arranged, and the downsizing of the power conversion device depends on the downsizing of the component parts. In addition, in a power conversion device of another example embodiment, the capacitor, the reactor, and the like that smooth DC voltage are downsized, and those parts are planarly arranged.

Therefore, the inverter device of the related art has a problem in that a large area needs to be secured in the vehicle for the installation into the vehicle and the downsizing of the entire inverter device is difficult to be achieved.

SUMMARY

The following configuration is included as one example measure for solving the abovementioned problem. That is, an example embodiment of the present disclosure is an inverter control device to drive a motor. The inverter control device includes a power module that supplies a driving current to the motor, a power module board that outputs a driving signal to the power module, a control board that outputs a control signal to the power module board, and a smoothing capacitor. The power module, the power module board, the capacitor, and the control board are sequentially stacked and accommodated in a single casing made of a metal material, the power module being a bottommost layer. An input terminal of a power supply current is arranged on one side surface of the casing and an output terminal of a driving current of the motor is arranged on another side surface of the casing orthogonal to the one side surface. The output terminal and a bus bar connected to the power module are directly connected to each other in the same plane.

The above and other elements, features, steps, characteristics and advantages of the present disclosure will become more apparent from the following detailed description of the preferred example embodiments with reference to the attached drawings.

DETAILED DESCRIPTION

Figure 1:
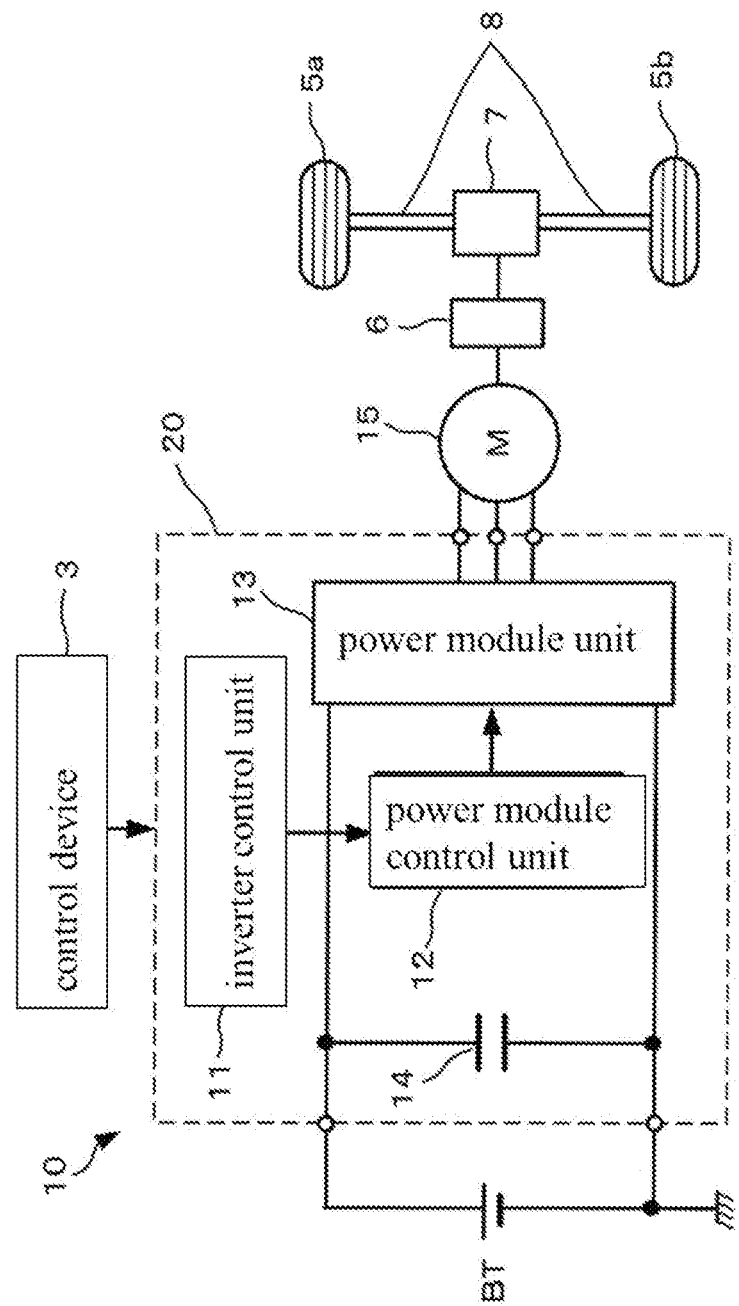
FIG. 1 is a schematic configuration of a vehicle in which an inverter control device according to an example embodiment of the present disclosure is installed.

Example embodiments according to the present disclosure is described below in detail with reference to the accompanying drawings. FIG. 1 is a schematic configuration of a vehicle in which an inverter control device according to an example embodiment of the present disclosure is installed. In FIG. 1, an electric motor 15 is a three-phase AC motor, for example, and is a driving force source of the vehicle. A rotation shaft of the electric motor 15 is connected to a reducer 6 and a differential gear 7, and a driving force (torque) of the electric motor 15 is transmitted to a pair of wheels 5a and 5b via the reducer 6, the differential gear 7, and a drive shaft (driving shaft) 8.

An inverter unit 20 of an inverter control device 10 includes a power module unit 13 that supplies driving power to the electric motor 15, a power module control unit 12 that outputs a driving signal to the power module unit 13, an inverter control unit 11 that outputs a control signal to the power module control unit 12, and a smoothing capacitor 14. The inverter unit 20 is controlled by a control signal from a control device 3 that is responsible for the control of the entire vehicle.

The power module unit 13 includes a bridge circuit (power conversion circuit) obtained by connecting two power switching elements (an upper-arm power switching element and a lower-arm power switching element) such as Insulated Gate Bipolar Transistors (IGBTs) and Metal Oxide Semiconductor Field Effect Transistors (MOSFETs) for each of a U-phase, a V-phase, and a W-phase, that is, a total of six power switching elements.

The power module unit 13 converts DC power from a battery BT to AC power (three-phase AC power) by switching the ON/OFF of the power switching elements by a driving signal (PWM control signal) from the power module control unit 12, and drives the electric motor 15 by the conversion.

The battery (BT) is a supply source of electrical energy that is a power source of the vehicle, and is formed by a plurality of secondary batteries, for example. The capacitor 14 is arranged in the inverter unit 20 at a part connected to the battery (BT). The capacitor 14 is connected between a high-potential line (positive-electrode potential B+) and a low-potential line (negative-electrode potential B− (GND)), and is a high-capacity smoothing capacitor (film capacitor) that smooths the input voltage from the battery BT.

Figure 2:
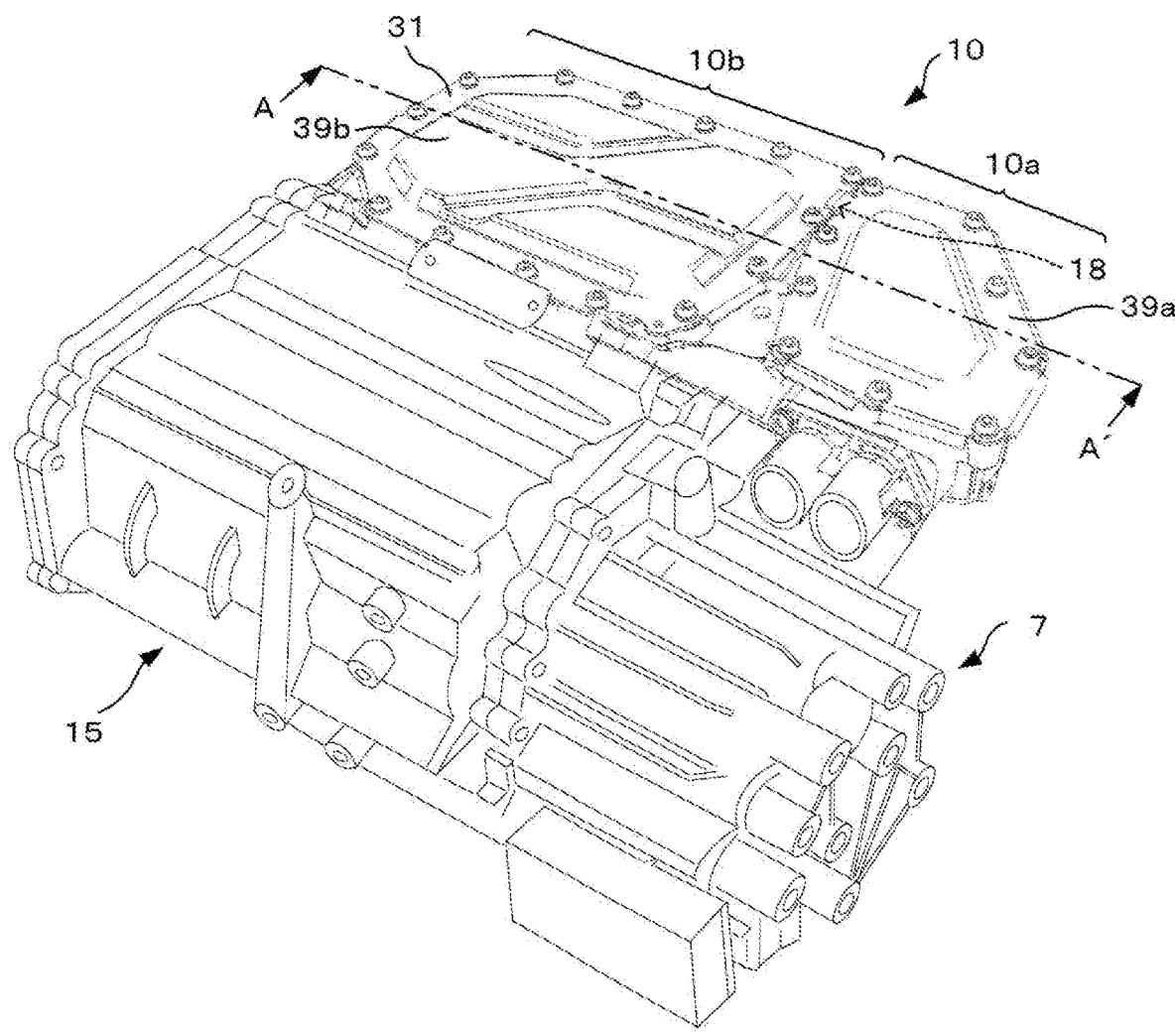
FIG. 2 is an external view of the inverter control device in which a driving motor and a gear are combined and integrated.

Next, the structure of the inverter control device according to this example embodiment is described. FIG. 2 is an external view of the inverter control device 10, and illustrates a state in which the inverter control device 10, the electric motor 15, and the gear 7 are combined and integrated. A casing 31 of the inverter control device 10 is obtained by molding an aluminum die casting, for example. The inverter control device 10 includes a high-voltage circuitry 10a that is an input unit for high-voltage current from an external battery (the battery (BT) in FIG. 1), and a power controller 10b that supplies driving current to a driving motor.

The high-voltage circuitry 10a and the power controller 10b are separated from each other via a partition wall 18 in the casing 31. Upper surface portions of the high-voltage circuitry 10a and the power controller 10b are covered with covers 39a and 39b that are flat-plate-like members made of metal such as aluminum, for example.

Figure 3:
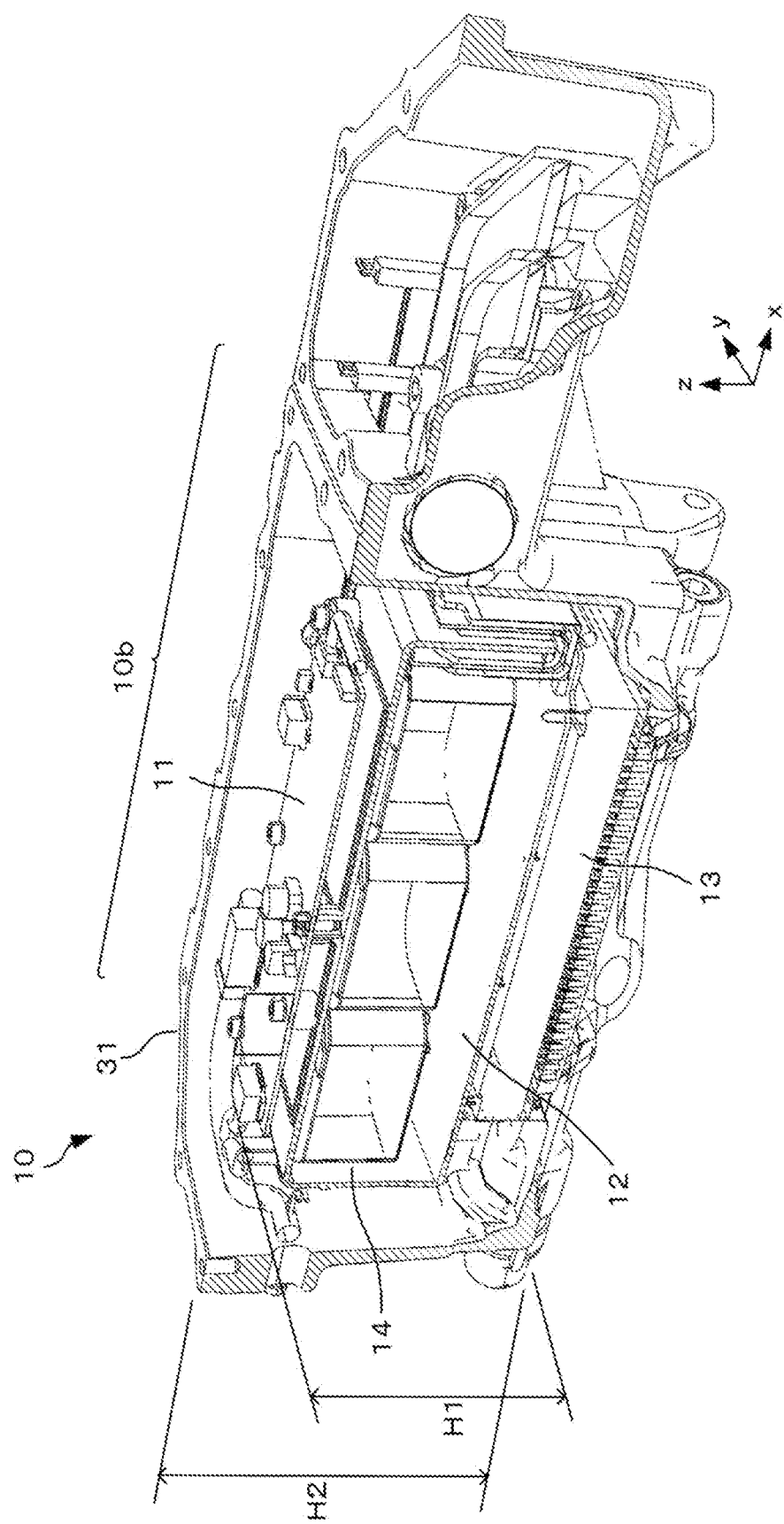
FIG. 3 is a cross-sectional view of the inverter control device in FIG. 2 taken along arrow line A-A' in a vertical direction.

FIG. 3 is a cross-sectional view of the inverter control device 10 illustrated in FIG. 2 taken along arrow line A-A' in a vertical direction, and illustrates a stacked state of the power module unit 13 and the like in the power controller 10b of the inverter control device 10. More specifically, the power module unit 13, the power module control unit (also referred to as a power module board) 12, the capacitor 14, and the inverter control unit (also referred to as a control board) 11 are accommodated in the power controller 10b in a sequentially stacked state. The power module unit 13 fixed to a casing bottom surface of the power controller 10b by a screw and the like is the bottommost layer.

In the inverter control device 10, the stacked height in the normal direction (the height in the z direction) H1 of the power module unit 13, the power module control unit 12, the capacitor 14, and the inverter control unit 11 is smaller than a depth H2 of the casing 31 in the z direction (H1<H2).

That is, all the component members can be accommodated in the capacity of the casing 31 of the inverter control device 10, and hence not a box-shaped member but flat-plate-like members made of metal such as aluminum can be used like the covers 39$_a$ and 39b as the cover member covering the casing 31. As a result, reduction in height and downsizing of the inverter control device 10 become possible.

Figure 4:
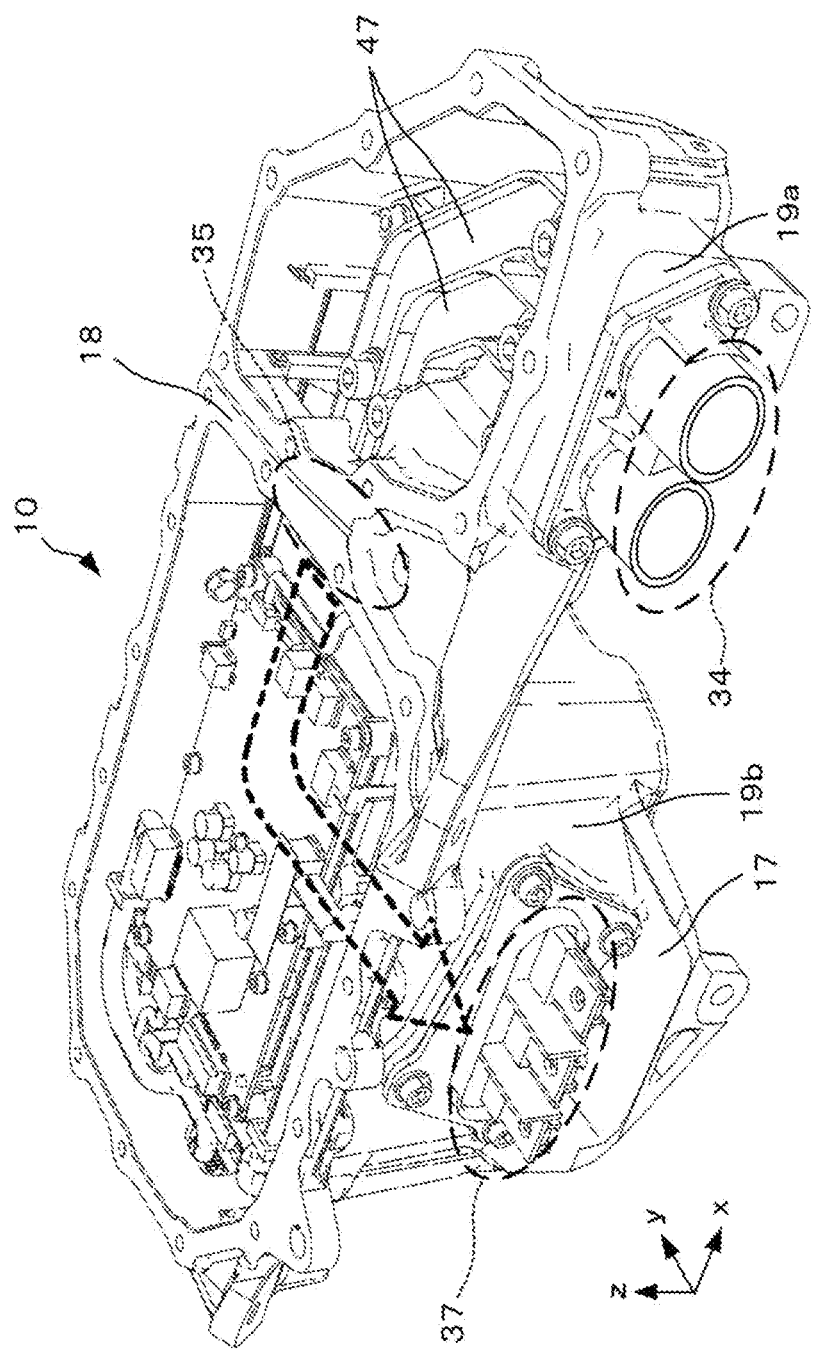
FIG. 4 is a view illustrating a current path from an input side to an output side of current in a power unit.

In addition, as illustrated in FIG. 4, in the inverter control device 10, the high-voltage current that is input from an external power supply input terminal 34 that is a connector for connection of the external battery is received by a connector (input terminal 35) of the high-voltage circuitry 10a via a bus bar 47 passing through the partition wall 18 and leading to the power controller 10b. The power for driving the motor from the power module unit 13 is supplied to the driving motor via a connector (output terminal 37) provided at the power controller 10b.

Therefore, in the inverter control device 10, the power supply is supplied to the input terminal 35 arranged on the partition wall 18 side of the power controller 10b through the external power supply input terminal 34 arranged on a front surface portion (front surface wall portion) 19a of the high-voltage circuitry 10a, and driving current is transmitted to the motor through the output terminal 37 provided on a front surface portion 19b of the power controller 10b via the power module unit 13 and the like.

The partition wall 18 between the high-voltage circuitry 10a and the power controller 10b is orthogonal to the front surface portion 19b when the power controller 10b is seen in a planar view, and hence the current path of the current from the input side to the output side in the power controller 10b is L-shaped as indicated by a dotted arrow in FIG. 4. The L-shaped current path as above is shorter than the current path when it is arranged in a U-shape by arranging the input side and the output side of the power supply on the same side surface, and hence the inverter control device can be downsized even more.

Figure 6:
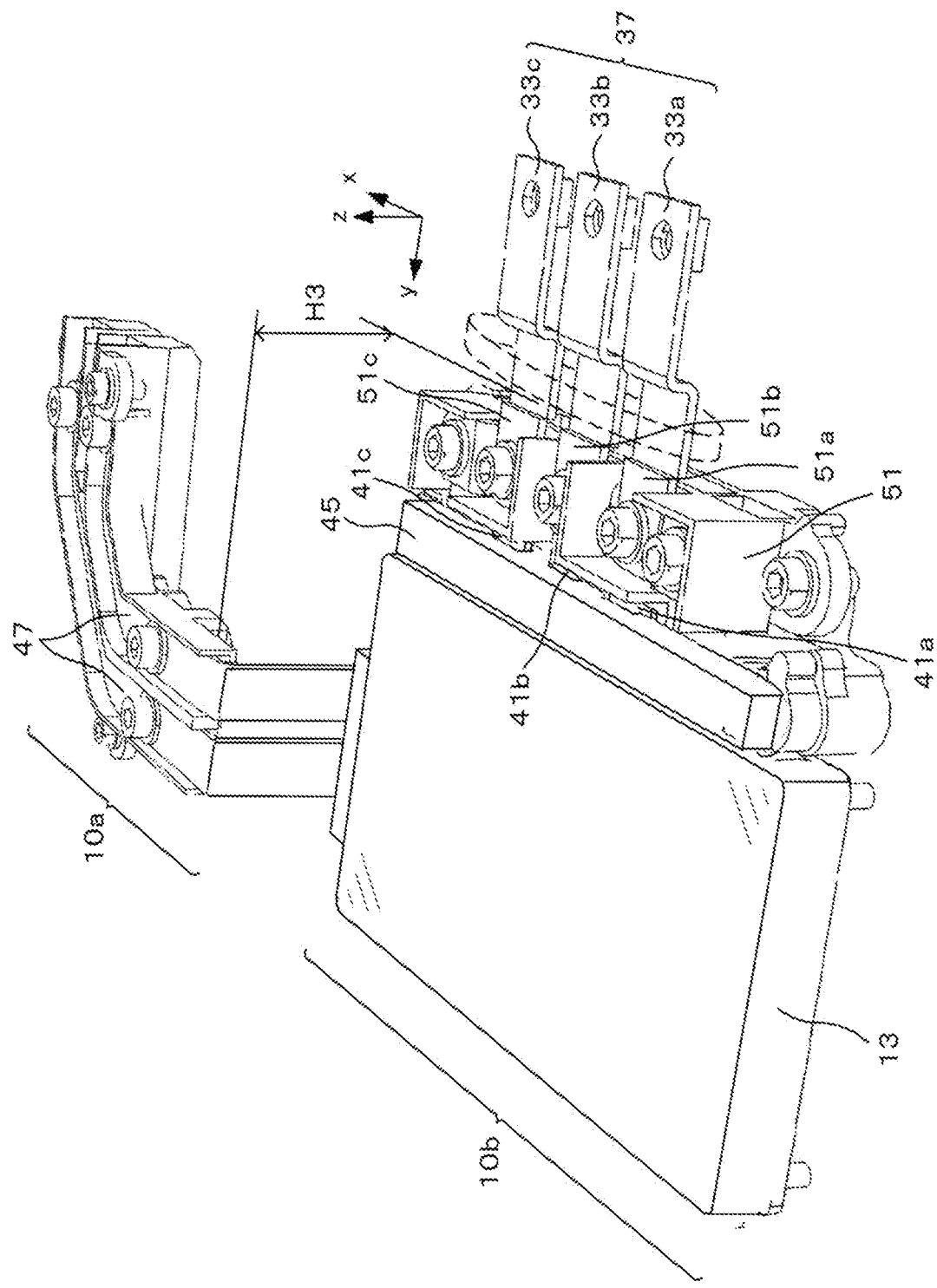
FIG. 6 is a detailed view of an output terminal of the inverter control device and a place near the output terminal.

Note that, in the inverter control device 10, the bus bar 47 of the high-voltage circuitry 10a and the output terminal of the power controller 10b are arranged with a height difference H3 in the height direction (z direction) of the casing 31 as illustrated in FIG. 6. That is, by providing the high-voltage circuitry 10a in a position higher than that of the output terminal 37, a space is formed on the lower side of the casing of the high-voltage circuitry 10a. Therefore, the gear and the like can be accommodated in the space, for example.

In addition, as illustrated in FIG. 4, a protruding portion 17 protruding from the casing 31 in a lower portion of the section of the casing 31 in which the output terminal 37 is arranged on a front surface side of the casing 31 (the front surface portion 19b of the power controller 10b). The protruding portion 17 is located in a connection part between the inverter control device 10 and the driving motor, and the protruding portion 17 functions as a reinforcement member of the casing 31 of the inverter control device 10 when the motor is fixed to the inverter control device 10.

Figure 5:
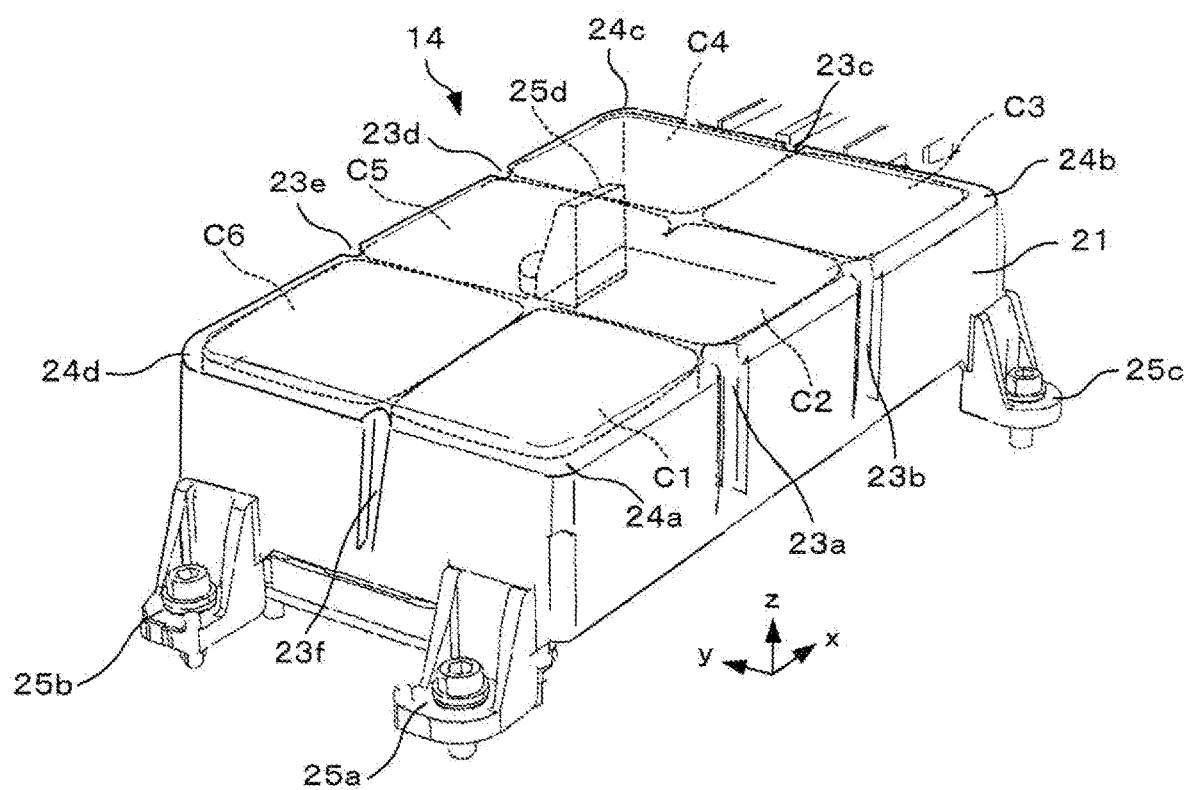
FIG. 5 is a detailed external view of a capacitor of the inverter control device.

FIG. 5 is a detailed external view of the capacitor 14 of the inverter control device 10. The capacitor 14 includes parallelly connecting a plurality of single capacitors (six single capacitors C1 to C6 herein) in order to obtain a desired electrostatic capacity. The plurality of single capacitors are accommodated in an outer case 21 made of resin.

In four side surface portions of the outer case 21, dents (recessed portions) 23a to 23f that conform to the outline of the single capacitors when the single capacitors are arranged so as to be adjacent to each other are formed. Further, rounded portions (roundness) 24a to 24d are provided at four edges (four corner portions) of the outer case 21. With the recessed portions and the roundness, the number of constituent materials of the outer case 21 of the capacitor can be reduced and the weight of the capacitor can be reduced.

In addition, as illustrated in FIG. 5, attachment members 25a to 25d to be fixed to a bottom surface portion of the casing 31 are formed in the corner portions of the bottom portion of the outer case 21 of the capacitor 14. The attachment members 25a and 25b provided at both ends of one side surface portion of the outer case 21 in the x direction extend in the longitudinal direction (x direction) of the main body of the capacitor. The attachment members 25c and 25d provided at end portions opposed to both of the side surface portions of the outer case 21 in the y direction extend in the short direction (y direction) of the main body of the capacitor.

Now, the attachment members 25a to 25d are arranged and extend to fit the shape of the inner peripheral wall of the casing 31. As a result, a routing space for a harness can be secured on the inner wall side of the casing 31, and the reduction of the volume of the casing 31 of the inverter control device 10 becomes possible at the same time.

FIG. 6 is a detailed view of the output terminal of the inverter control device 10 and a place near the output terminal. The output terminal 37 includes metal plates corresponding to three phases, that is, the U-phase, the V-phase, and the W-phase, for example, three terminal boards 33a to 33c made of copper. The terminal boards 33a to 33c are parallelly arranged on a terminal block 51 disposed on the front surface portion side and near the bottom surface of the power controller 10b, and protrude to the outside from the front surface portion 19b of the power controller 10b as illustrated in FIG. 4 in order to facilitate the connection with driving motor.

Three bus bars 41a to 41c made of copper, for example, corresponding to the three phases, that is, the U-phase, the V-phase, and the W-phase are connected to the output terminal of the power module unit 13 that supplies the power for driving the motor in the inverter control device 10. The bus bars 41a to 41c are T-shaped members in a planar view, for example, and one end of each of the bus bars 41a to 41c and one end of each of the terminal boards 33a to 33c of the output terminal 37 are connected to each other via the terminal block 51 so as to correspond to each of the three phases.

The terminal block 51 is made of an insulating resin, has an elongated shape extending in the x direction along the front surface portion 19a, and is formed so that one end of each of the bus bars 41a to 41c and one end of each of the terminal boards 33a to 33c can be screwed together. Screwing portions 51a to 51c of the terminal block 51 each have a height that enables the terminal boards 33a to 33c and the bus bars 41a to 41c to be arranged in the same plane in the height direction (z direction). As a result, terminal boards 33a to 33c and the bus bars 41a to 41c have the same height in the z direction with respect to the casing bottom portion of the power controller 10b, for example.

Note that the parallel arrangement intervals of the terminal boards 33a to 33c of the output terminal 37 may be changeable in accordance with the size of the power supply input terminal of the driving motor connected to the inverter control device 10 by changing the arrangement intervals of the screwing portions of the terminal block 51. As a result, the output terminal of the three-phase bridge circuit included in the power module unit 13 is changeable so as to fit the shape of the input terminal of the driving motor that is the connection destination thereof.

Further, as illustrated in FIG. 6, the inverter control device 10 includes a current sensor 45 for detecting the current flowing through each phase. The current sensor 45 has both end portions in the longitudinal direction that are fixed to the terminal block 51 by screws, and is arranged so as to be placed over the bus bars 41a to 41c of each phase while extending in a direction (x direction) orthogonal to the longitudinal direction (y direction) of the output terminal of the power module unit 13.

As described above, the terminal block 51 also serves as a fixing member of the current sensor, the bus bar, and the like. As a result, the arrangement and the fixation of the current sensor in the output terminal can be optimized (space saving).

As described above, the inverter control device according to this example embodiment has a configuration in which the power module unit, the power module control unit, the capacitor, and the inverter control unit are sequentially stacked in the casing from the bottom surface thereof to the upper direction in proximity to each other, and are completely accommodated in the casing.

Further, the current path of the current from the input side to the output side in the power controller is an L-shape by arranging the external power supply input terminal and the output terminal that supplies the driving current to the motor on the front surface portion (front surface side wall portion) of the inverter control device and by supplying the power supply to the power module unit and the like included in the power controller from the input terminal arranged on the side surface portion orthogonal to the front surface portion.

By the configuration as above, the device weight can be reduced and the arrangement area can be reduced by the downsizing and the reduction in the height of the entire inverter control device. Further, the current path in the power controller and the wiring distance of a wire harness and the like in the inverter control device are reduced, and power loss can be reduced, radiation noise can be prevented from being generated, and the influence of external noise can be suppressed in accordance with the reduction of the resistance value due to the power supply path length and the like being short.

In addition, the current path can be caused to be the shortest, the generation of electromagnetic noise can be suppressed, and the influence of external noise can be avoided by arranging the current output terminal to the motor and the bus bar of the power module unit in the power controller so that the bus bar and the current output terminal do not rise in the vertical direction but are directly connected to each other in the same plane so as to be flat in the horizontal direction.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inverter control device to drive a motor, the inverter control device comprising: a power module that supplies a driving current to the motor; a power module board that outputs a driving signal to the power module; a control board that outputs a control signal to the power module board; and a smoothing capacitor; wherein the power module, the power module board, the capacitor, and the control board are sequentially stacked and accommodated in a single casing made of a metal material, the power module being a bottommost layer; an input terminal of a power supply current is located on one side surface of the casing and an output terminal of the driving current of the motor is located on another side surface of the casing orthogonal to the one side surface; and the output terminal and a bus bar connected to the power module are directly connected to each other in a same plane.

2. The inverter control device according to claim 1, wherein a terminal block is adjacent to the other side surface of the casing so that the output terminal and the bus bar connected to the power module have a same height.

3. The inverter control device according to claim 1, wherein a stacked height of the power module, the power module board, the capacitor, and the control board does not exceed a depth dimension of the casing.

4. The inverter control device according to claim 1, wherein:
a pair of attachment members provided on one side-surface side of the capacitor out of attachment members that attach the capacitor to the casing extends in a longitudinal direction of a main body of the capacitor, and a pair of attachment members provided on another side-surface side of the capacitor extends in a short direction of the main body of the capacitor; and the attachment members conform to a shape of an inner peripheral wall of the casing.

5. The inverter control device according to claim 1, wherein:

the capacitor includes a plurality of single capacitors;

a plurality of recessed portions are provided in a side surface of an outer case of the capacitor to conform to an outline of an arrangement of the single capacitors; and the outer case includes a rounded corner portion.

6. The inverter control device according to claim 1, wherein a power supply path to the input terminal is located above the output terminal in a height direction of the casing.

7. The inverter control device according to claim 1, wherein the output terminal includes metal plates arranged in parallel and at a same height on the terminal block to correspond to a number of phases of the motor.

8. The inverter control device according to claim 7, wherein a parallel arrangement interval between the metal plates is changeable in accordance with a size of a power supply input terminal of the motor.

9. The inverter control device according to claim 1, wherein a current sensor fixed to the terminal block and located over the output terminal while extending in a direction orthogonal to a longitudinal direction of the output terminal is provided.

10. The inverter control device according to claim 1, wherein:

a protruding portion protrudes from the casing adjacent to a section of the casing in which the output terminal is located; and the protruding portion is a connection section between the inverter control device and the motor.

11. An inverter control device for driving a motor, the inverter control device comprising:

a power module that supplies a driving current to the motor;

a power module board that outputs a driving signal to the power module;

a control board that outputs a control signal to the power module board; and a smoothing capacitor; wherein the power module, the power module board, the capacitor, and the control board are sequentially adjoined and accommodated in a single casing made of a metal material;

both of an input terminal and an output terminal of a power supply current are on a side surface of the casing; when the control board is seen in a planar view, a current path of the power supply current from the input terminal to the output terminal in the power module is L-shaped.

12. The inverter control device according to claim 11, wherein the power module is on the side surface of the casing.

13. The inverter control device according to claim 11, wherein the input terminal of the power supply current is on one side surface of the casing and the output terminal of the driving current of the motor is on another side surface of the casing orthogonal to the one side surface.

14. The inverter control device according to claim 11, wherein the output terminal and a bus bar connected to the power module are directly connected to each other in a same plane.

15. The inverter control device according to claim 11, wherein the power module, the power module board, the capacitor, and the control board are sequentially stacked and accommodated in a single casing made of a metal material, the power module unit being a bottommost layer.

16. The inverter control device according to claim 13, wherein the output terminal and a bus bar connected to the power module are directly connected to each other in a same plane.

* * * * *